United States Patent
Moriya et al.

(10) Patent No.: US 7,241,685 B2
(45) Date of Patent: Jul. 10, 2007

(54) SEMICONDUCTOR DEVICE AND METHOD OF MANUFACTURING THE SAME

(75) Inventors: Hiroshi Moriya, Chiyoda (JP); Tomio Iwasaki, Tsukuba (JP); Hideo Miura, Koshigaya (JP); Shinji Nishihara, Kokubunji (JP); Masashi Sahara, Hitachinaka (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/390,413

(22) Filed: Mar. 18, 2003

(65) Prior Publication Data

US 2003/0170980 A1  Sep. 11, 2003

Related U.S. Application Data

(62) Division of application No. 09/941,616, filed on Aug. 30, 2001, now Pat. No. 6,545,362.

(30) Foreign Application Priority Data

Aug. 30, 2000  (JP)  ............................. 2000-260107

(51) Int. Cl.
*H01L 21/44* (2006.01)

(52) U.S. Cl. .................. 438/652; 438/653; 438/688

(58) Field of Classification Search ................ 438/652, 438/688, 653, 672, FOR. 357, FOR. 358, 438/584, 597, 642, 687, 618, 627, 628, 643, 438/644, 605, 614; 257/762, 765
See application file for complete search history.

(56) References Cited

U.S. PATENT DOCUMENTS

| | | | | |
|---|---|---|---|---|
| 5,350,484 A | * | 9/1994 | Gardner et al. | 438/669 |
| 5,420,070 A | * | 5/1995 | Matsuura et al. | 438/625 |
| 5,561,326 A | * | 10/1996 | Ito et al. | 257/751 |
| 5,736,002 A | * | 4/1998 | Allen et al. | 438/705 |
| 5,904,556 A | | 5/1999 | Suzuki et al. | |
| 6,090,710 A | * | 7/2000 | Andricacos et al. | 438/687 |
| 6,187,662 B1 | * | 2/2001 | Usami et al. | 438/624 |

(Continued)

FOREIGN PATENT DOCUMENTS

JP   07-193066   *   7/1995

(Continued)

*Primary Examiner*—Brook Kebede
*Assistant Examiner*—Khiem Nguyen
(74) *Attorney, Agent, or Firm*—Antonelli, Terry, Stout & Kraus, LLP.

(57) ABSTRACT

There is provided a semiconductor device having a wiring structure which reduces possibility of a short circuit, and method of making the device. Besides, there is provided a semiconductor device having high reliability. Further, there is provided a semiconductor device having high yield. A wiring line is formed at one main surface side of a semiconductor substrate, and has a laminate structure of an adjacent conductor layer and a main wiring layer. The main wiring layer contains an added element to prevent migration. The adjacent conductor layer is formed of a material for preventing a main constituent element and the added element of the main wiring layer from diffusing into the substrate beneath the adjacent conductor layer, and the concentration of the added element at a location close to an interface between the adjacent conductor layer and the main wiring layer is low compared to the concentration of the added element in the main wiring layer spaced from the adjacent conductor layer.

24 Claims, 7 Drawing Sheets

U.S. PATENT DOCUMENTS

| | | | |
|---|---|---|---|
| 6,346,747 B1 * | 2/2002 | Grill et al. | 257/752 |
| 6,407,453 B1 * | 6/2002 | Watanabe et al. | 257/758 |
| 6,503,803 B2 * | 1/2003 | Todorobaru et al. | 438/296 |
| 6,555,465 B2 * | 4/2003 | Yamaha | 438/624 |
| 6,569,742 B1 * | 5/2003 | Taniguchi et al. | 438/303 |
| 6,762,501 B1 * | 7/2004 | Park et al. | 257/765 |
| 6,803,300 B2 * | 10/2004 | Higashi et al. | 438/598 |
| 2004/0089947 A1 * | 5/2004 | Iwasaki et al. | 257/753 |

FOREIGN PATENT DOCUMENTS

JP      8-186175      7/1996

\* cited by examiner

SEMICONDUCTOR DEVICE AND METHOD OF MANUFACTURING THE SAME

This application is a Divisional application of prior application Ser. No. 09/941,616, filed Aug. 30, 2001 now U.S. Pat. No. 6,545,362, the contents of which are incorporated herein by reference in their entirety.

BACKGROUND OF THE INVENTION

The present invention relates to a semiconductor device and a method of manufacturing the semiconductor device.

A semiconductor device has been miniaturized in recent years. As miniaturization has proceeded, the width of metal wiring lines in the device has narrowed, and, therefore, an aluminum comprising copper of about 0.5% by weight is generally used to prevent disconnection of a wire, or a hillock, in an aluminum wiring line due to migration.

However, in the case of the aluminum wiring line containing copper, there is a case where copper atoms are precipitated. The location of precipitation is around a grain boundary or an interface between an adjacent conductor layer and a main wiring layer. Especially, when a precipitate become large around the interface, there is a case where the precipitates remain there since the precipitate is not etched. In the case where a wiring interval (space between wirings) is narrow, it is a cause of short circuit failure between adjacent wiring lines.

Since there is a tendency that not only a width of the wiring line but also an interval between wiring lines narrow, the problem of short circuit failure can be serious. Then, for example, Japanese Patent Laid Open No. 186175/1996 discloses a method in which after forming an aluminum film and dissolving copper into the aluminum at high temperature, rapid cooling is carried out to prevent copper precipitates at the cooling.

SUMMARY OF THE INVENTION

To prevent short circuit failure between wiring lines, the method of manufacturing an aluminum wiring line containing copper by rapid cooling treatment is not satisfactory in the case where the semiconductor device has less than a 0.4 µm interval between wiring lines. In order to prevent short circuit failure between wiring lines, especially, it should be prevented that copper precipitates around the interface between an adjacent conductive layer and an aluminum wiring layer.

Therefore, an object of the present invention is to provide a semiconductor device having a wiring structure in which a short circuit can be avoided.

Furthermore, another object of the present invention is to provide a semiconductor device having high reliability.

Another object of the present invention is to provide a semiconductor device having high productivity.

A semiconductor device of the present invention comprises a semiconductor substrate, a wiring line overlying a main surface of said semiconductor substrate, and an insulating layer adjacent the wiring line. The wiring line has a main wiring layer, and the main wiring layer has a main constituent element and an added material (e.g., element). The concentration of the added material at a first portion in the main wiring layer is higher than that at a second portion, the second portion being closer to the insulating layer than said first portion of the main wiring layer is to the insulating layer. Desirably, the wiring line includes the main wiring layer and an adjacent conductor layer located between the main wiring layer and the insulating layer, and the second portion of the main wiring layer, having the lower concentration of the added material than the first portion, is closer to the interface of the main wiring layer and adjacent conductor layer than the first portion is to this interface.

Besides, a semiconductor device of the present invention includes a semiconductor substrate, a wiring line overlying a main surface of the semiconductor substrate, and an insulating layer adjacent the wiring line. The wiring line has a main wiring layer and, e.g., an adjacent conductor layer located between the main wiring layer and the insulating layer. The main wiring layer can be made of aluminum as a constituent (main) material and copper as an added material, and the adjacent conductor layer can be made of titanium or titanium nitride as a constituent material. Illustratively, as an alternative the constituent (main) element of the main wiring layer can be copper, with nickel as the added material; moreover, the adjacent conductor layer can be made of ruthenium. The concentration of the added material in a first portion in the main wiring layer is higher than that in a second portion located closer to the interface with the adjacent conductor layer than the first portion of said main wiring layer is to this interface.

Besides, a semiconductor device of the present invention comprises a semiconductor substrate, a wiring line on a main surface of said semiconductor substrate, and an insulating layer adjacent said wiring line. The wiring line has a layered structure. The layered structure has a layered main wiring layer and, e.g., an adjacent conductor layer located between said main wiring layer and said insulating layer. Said layered main wiring layer has a first main wiring layer, and a second main wiring layer located between said first main wiring layer and said adjacent conductor layer. A concentration of added material in said first main wiring layer is higher than that in said second main wiring layer.

Furthermore, the semiconductor device of the present invention can have the following: the concentration of copper in said first main wiring layer or first portion can be 0.4% by weight or more, and the concentration of said copper in said second wiring layer can be from 0% to 0.2% by weight (including the end points). Illustratively, and not to be limiting, the high-concentration portion of the wiring layer can have up to 5% by weight copper.

Besides, a semiconductor device of the present invention includes a semiconductor substrate, a wiring line overlying a main surface of the semiconductor substrate, and an insulating layer formed adjacent the wiring line. The wiring line has a layered structure. The layered structure has a layered main wiring layer and an adjacent conductor layer located between said main wiring layer and said insulating layer. Said main wiring layer has a first main wiring layer and a second main wiring layer located between said first main wiring layer and said adjacent conductor layer. The thickness of said second main wiring layer is from 5 nm to 40 nm. Illustratively, and not to be limiting, the first main wiring layer can have a thickness of 50 nm or more, and 3000 nm or less.

Furthermore, the semiconductor device of the present invention can have the following: the thickness of said second main wiring layer is from 5 nm to 40 nm, or, a part of said wiring line is formed a smaller distance than 0.4 µm (e.g., illustratively, and not to be limiting, about 50 nm, based upon present manufacturing machine capabilities) from another part of the wiring line located separately from the first-mentioned part of the wiring line.

Furthermore, the semiconductor device of the present invention can have the following: the first main wiring layer and the second main wiring layer have a same material as a constituent (main) element.

Besides, a semiconductor device of the present invention comprises a semiconductor substrate, a conducting means for conducting electricity overlying a main surface of said semiconductor substrate, and a layer for insulating said conducting means adjacent said conducting means. Said conducting means has main conducting means for conducting electricity and, e.g., an adjacent conducting means for obstructing movement of constituent material and/or added material of said main conducting means to said insulating means and located between said main conducting means and said insulating means. Said main conducting means has first main wiring means for conducting electricity and second main wiring means for obstructing movement of said added material of said first main wiring means toward said adjacent conducting means through said second main wiring means.

In the semiconductor device of the present invention, for example, said conducting means may be the wiring line, said insulating means may be the insulating layer, said main conducting means may be the main wiring layer, said adjacent conducting means may be the adjacent conducting wiring layer, said first main wiring means may be the first main wiring layer, and said second main wiring means may be the second main wiring layer. The semiconductor device of the present invention further includes that said first main wiring layer and said second wiring layer can have a same material as the constituent element.

Besides, a method of manufacturing a semiconductor device of the present invention comprises forming a first insulating layer on a semiconductor substrate, and forming a wiring line overlying said first insulating layer. A second insulating layer can be formed on said wiring line. The process of forming the wiring line comprises forming a first main wiring layer overlying the first insulating layer, and forming a second main wiring layer on said first main wiring layer, whereby the concentration of an added material in said first main wiring layer is less than that in said second main wiring layer. Desirably, the process of forming the wiring line includes forming an adjacent conductor layer on the first insulating layer, forming the first main wiring layer on the adjacent conductor layer, and forming the second main wiring layer on the first main wiring layer. The first and second main wiring layers have relative amounts of the added material as discussed previously. Alternatively the wiring line can be formed by forming the adjacent conductor layer and forming a main wiring layer on the adjacent conductor layer; the main wiring layer can have a varying concentration of an added material therein, from a relatively low concentration at the adjacent conductor layer to a higher concentration spaced from the adjacent conductor layer.

The method of manufacturing a semiconductor further can comprise wherein said main wiring layer comprises aluminum as a constituent (main) material and copper as the added material, and said adjacent conductive layer comprises titanium or titanium nitride as a constituent material. In the method of manufacturing a semiconductor device as in the present invention, the concentration of copper in the first main wiring layer can be 0.4% by weight or more, and that in second main wiring layer can be from 0% to 0.2% by weight. In the method according to the present invention, said second main wiring layer can be formed at 550° K or more, and said second main wiring layer can be cooled rapidly (e.g., at least 100° C./min). In the method according to the present invention, said second main wiring layer can be cooled rapidly by providing a fluid to cool.

Since the concentration of the added element in the vicinity of the interface between, e.g., the adjacent conductor layer and the main wiring layer is low, the generation of a precipitate in the vicinity of the interface can be suppressed, so that a wiring structure avoiding a short circuit can be obtained, and the object of the present invention can be achieved.

Further, since the semiconductor device having the wiring structure in which the short circuit is hard to cause is obtained, the semiconductor device having high reliability can be provided, and the semiconductor device having high yield can be provided, so that the objects of the present invention can be achieved.

DETAILED DESCRIPTION OF THE PREFERRED EMBODIMENTS

Hereinafter, embodiments of the present invention will be described in detail with reference to the drawings.

While the invention will be described in connection with specific and preferred embodiments, it will be understood that it is not intended to limit the invention to those embodiments. To the contrary, it is intended to cover all alterations, modifications and equivalents as may be included within the spirit and scope of the invention as defined by the appended claims.

Throughout the present specification, where materials, method and apparatus are described as including or comprising specific components or structure or specific processing steps, it is contemplated by the inventors that materials, methods and apparatus of the present invention also consist essentially of, or consist of, the recited components or structure or recited processing steps.

Figure 1:
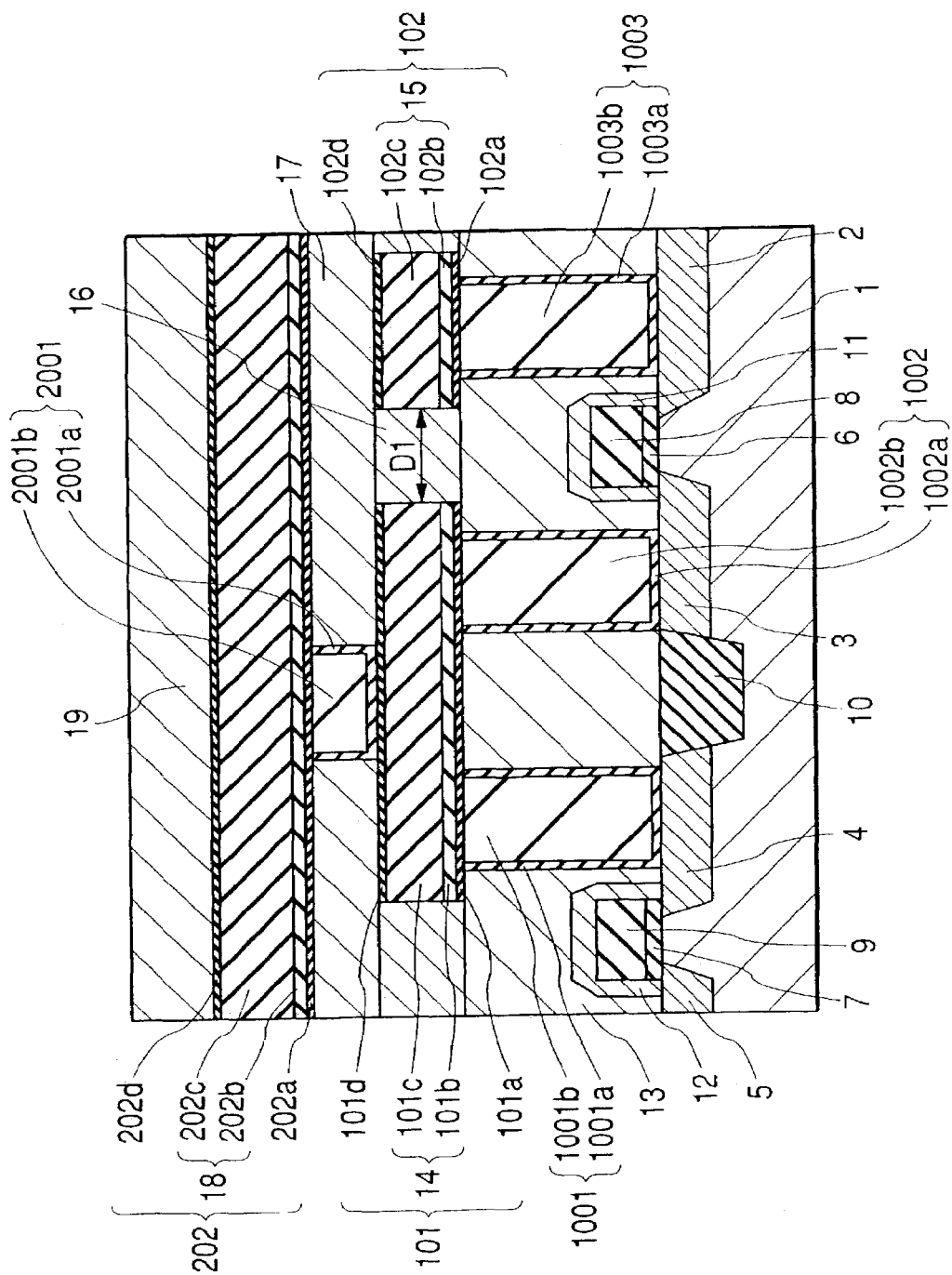
FIG. 1 is a sectional view of a main portion of a semiconductor device according to a first embodiment of the present invention.

First, FIG. 1 shows a cross section of a main portion in a semiconductor device according to a first embodiment of the present invention. Diffusion layers 2, 3, 4 and 5 are formed on a silicon substrate 1, and gate insulating films 6 and 7 and gate electrodes 8 and 9 are formed on the substrate between the diffusion layers, so that MOS (Metal Oxide Semiconductor) transistors are constituted. For example, the gate insulating films 6 and 7 can be silicon oxide films or silicon nitride films, and the gate electrodes 8 and 9 can be polycrystalline silicon films, metal thin films, metal silicide films, or laminate structure films of those. Moreover, MOS transistors are separated by an element separator film 10 made of, for example, silicon oxide. Insulating films 11 and 12 made of, for example, silicon oxide are formed at an upper portion and on side walls of the gate electrodes 8 and 9.

An insulating film 13 is formed all over the upper portion of the MOS transistor, and, for example, the film 13 is made of a BPSG (Boron-Doped Phospho-Silicate Glass) film, a SOG (Spin-On-Glass) film, or a silicon oxide film or a nitride film formed by a chemical vapor evaporation method or a sputtering method.

Contact holes are formed in insulating film 13. A main conductor element 1001*b* has an adjacent conductive film 1001*a* interposed between insulation film 13 and main conductor element 1001*b*, for preventing diffusion of conductive element to the insulating film 13. A main conductive element 1002*b* has an adjacent conductor film 1002*a* interposed between insulating film 13 and main conductive element 1002*b*; and a main conductor element 1003*b* has an adjacent conductor film 1003*a* interposed between insulation film 13 and main conductor element 1003*b*, whereby plugs 1001, 1002, and 1003 are formed, and they are electrically connected respectively to diffusion layers 2, 3 and 4.

A main conductor film 14 having the adjacent conductor films 101*a*, 101*d* for preventing diffusion, and a main conductor film 15 having the adjacent conductor films 102*a*, 102*d* for preventing diffusion, are respectively connected to diffusion layers through the plugs. Structures 101*a–d* and 102*a–d* respectively form first laminate wiring lines 101 and 102. The main conductor film 14 has a main conductor layer 101*c* and a main conductor layer 101*b*, and the main conductor layer 101*b* is electrically connected with the adjacent conductor film 101*a*. Furthermore, the main conductor layer 101*c* has an added element for preventing migration at a high concentration, and the main conductor layer 101*b* has an added element at a lower concentration than that in the main conductor layer 101*c* or does not have the added element.

The main conductor film 15 has a main conductor layer 102*c* and a main conductor layer 102*b*, and the main conductor layer 102*b* is electrically connected with the adjacent conductor film 102*a*. Furthermore, the main conductor layer 102*c* has an added element, for preventing migration, at a high concentration, and the main conductor layer 102*b* has an added element at a lower concentration than that in the main conductor layer 102*c* or does not have the added element.

Namely, the concentration of the added element in the main conductor film, at a portion close to (e.g., adjacent) the interface between the main conductor film and adjacent conductor layer, is lower than that at a portion of the main conductor film not close to the interface. That is, the concentration of the added element in the main conductor film at a place becomes low (including 0) as the place becomes close to the interface between the adjacent conductor layer and the main conductor film. In this case, main conductor layer 102*b* having an added element at a low concentration faces (or is adjacent) the interface.

The first laminate wiring lines 101 and 102 are, for example, obtained by manufacturing steps as follows: after forming the adjacent conductive films 101*a* and 102*a*, as part of a continuous conductive film, by, e.g., a physical vapor growth method, such as a sputtering method or the like, layers 101*b* and 102*b* (as part of a continuous layer) having added element at low concentration or not having the added element are formed by, e.g., a physical vapor growth method, such as sputtering or the like, and layers 101*c* and 102*c* (as part of a continuous layer), having the added element at a relatively high concentration, are formed by, e.g., a physical vapor growth method, such as sputtering or the like on the continuous layer for forming layers 101*b* and 102*b*. The main conductor films 14 and 15 include the added element, for preventing migration, on the adjacent conductive film. Next, adjacent conductive films 101*d*, 102*d*, as part of a continuous layer, are formed on the structure for forming films 14 and 15, by, e.g., a physical vapor growth method, such as a sputtering method or the like, and then a wiring pattern is formed by etching.

The structure of the wiring line in the foregoing embodiment has main conductor layers 101*b* and 102*b* including the added element at low concentration on the side of the interface with the adjacent conductive films 101*a* and 102*a*, respectively, in the main conductor films 14 and 15. The generation of a precipitate in the vicinity of the interface can be suppressed; and it does not occur that the precipitate is not etched and remains at the time of patterning the wiring line by etching. Thus, the structure prevents a short circuit between wiring lines even if the interval D1 between wiring lines is narrow.

In addition, an insulating film 17 is formed on the first laminate wiring lines 101 and 102, and the second laminate wiring line 202 is formed on the insulating film 17. The first laminate wiring layer 101 is connected to the second laminate wiring line 202 through the plug 2001 formed in a contact hole in the insulating film 17.

The plug 2001 comprises an adjacent conductive film 2001*a* for preventing diffusion and a conductor 2001*b*. The second laminate wiring line 202 comprises the adjacent conductor films 202*a* and 202*d* for preventing diffusion and main conductor film 18. The main conductor film 18 comprises a main conductor layer 202*c* having an added element, for preventing migration, at a high concentration and a main conductor layer 202*b* having an added element at a concentration lower than that of the main conductor layer 202*c* or not having the added element. The main conductor layer 202*b* can be contacted with the adjacent conductor film 202*a*.

The manufacturing steps of the second laminate wiring line 202 is, for example, as follows: for example, after forming the adjacent conductor film 202*a* by a sputtering method or the like, as part of a continuous film, the main conductor layer 202*b* including the added element at a relatively low concentration or not having the added element is formed by sputtering or the like, as part of a continuous film. Next, the main conductor layer 202*c* comprising the added element for preventing migration, is formed on main conductor layer 202*b*, e.g., by sputtering or the like, as part of a continuous film. The adjacent conductor film 202*d* is formed by a sputtering method or the like on the main conductor layer 202*c*, as part of a continuous film, and the wiring pattern is then formed by etching.

Figure 2:
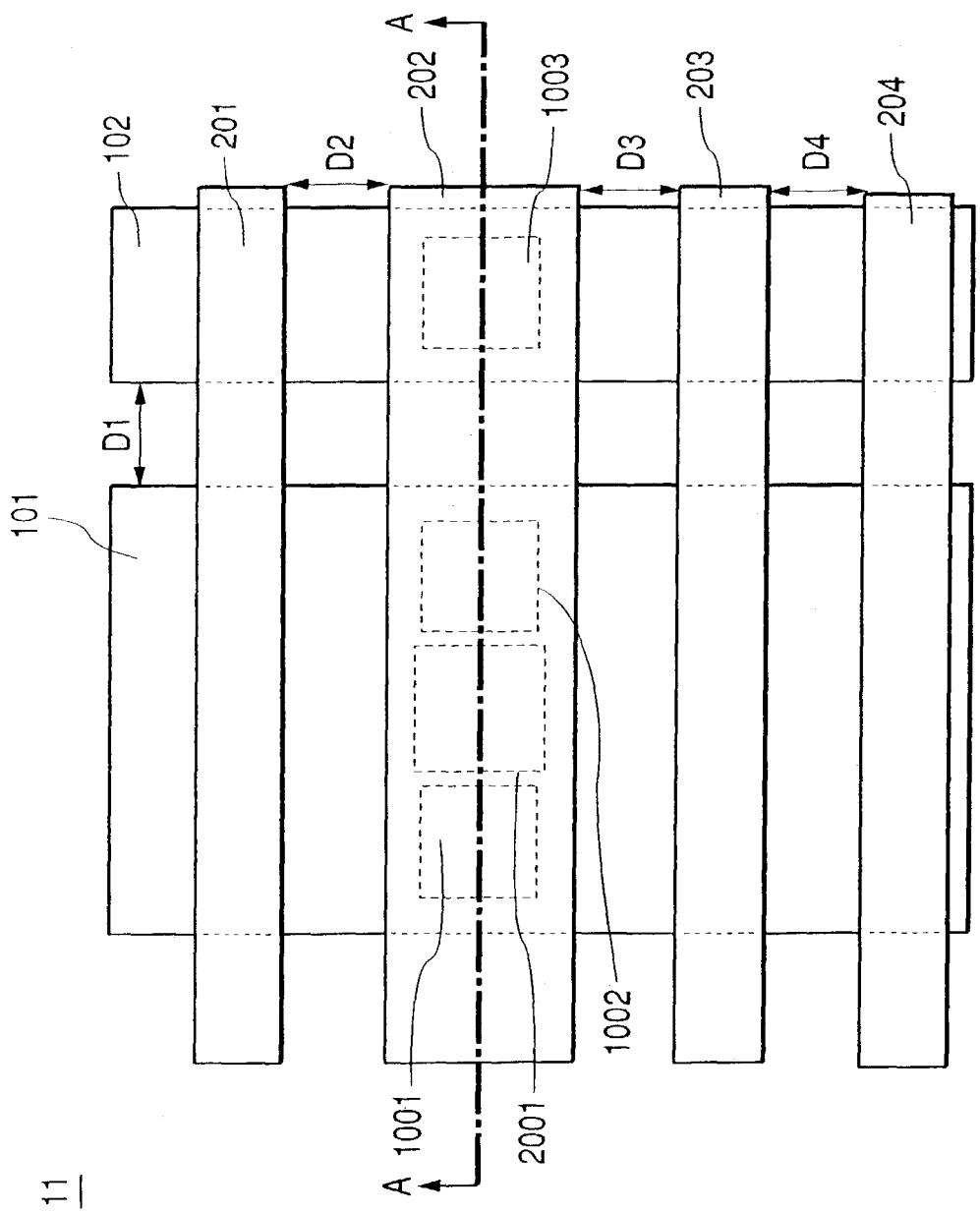
FIG. 2 is a view showing an example of a plane pattern of a wiring line and a plug in FIG. 1.

FIG. 2 is a view showing an example of a plane pattern of the first laminate wiring lines 101 and 102, the second laminate wiring line 202, and the plugs 1001, 1002, 1003 and 2001. FIG. 1 shows the sectional structure of the main portion of the semiconductor device according to the first embodiment of the present invention, and FIG. 1 shows a section A–A' of FIG. 2. However, FIG. 1 shows the insulation films and the structural portions of the MOS transistor in addition to the wiring lines. Reference characters D1, D2, D3 and D4 respectively designate intervals between the wiring line 101 and the wiring line 102, between the wiring line 201 and the wiring line 202, between the wiring 202 and the wiring line 203, and between the wiring 203 and the wiring line 204. The wiring lines 201, 203 and 204 include a coating (or cover) of adjacent conductor films for preventing diffusion similarly to the wiring line 202, and are respectively constituted by a main conductor containing an added element to prevent migration and a conductor containing the added element at a low concentration or not containing the added element.

Since the wiring structure of the semiconductor device of the present invention includes the main conductor layer 202b containing the added element at a low concentration, at the interface between the main conductor film 18 and the adjacent conductor film 202a, the generation of a precipitate in the vicinity of the interface can be suppressed, which avoids a precipitate in the vicinity of the interface which is not etched and remains when patterning to form the wiring line by etching, and thus avoids a short circuit between adjacent wiring lines due to any such precipitate even in the case where the wiring line intervals D1, D2, D3 and D4 are narrow.

Although the main conductor film 14 in FIG. 1 has the two layers, of the main conductor layer 101c containing the added element to prevent migration at a relatively high concentration and the main conductor layer 101b containing the added element at a relatively low concentration or not containing the added element, the main conductor film may have films of three or more layers in which another conductor layer is included between the main conductor layer 101c and the main conductor layer 101b, although not shown. The same is true of the main conductor films 15 and 18.

The main constituent material of the adjacent conductor films 1001a, 1002a, 1003a, and 2001a constituting the plugs 1001, 1002, 1003 and 2001 is, for example, titanium or titanium nitride, and the main constituent material of the conductors 1001b, 1002b, 1003b and 2001b is, for example, tungsten.

The main constituent material of the main conductor films 14, 15 and 18 in the first laminate wiring line and the second laminate wiring line is, for example, aluminum, and in this case, the added element for migration resistance may be, for example, copper. The concentration of the added element in the main conductor layers 101c, 102c, and 202c is, for example, 5% by weight or less, and the concentration of the added element of the main conductor layers 101b, 102b and 202b can be 0% and up to (and including) 0.2% by weight. In this embodiment, since the main conductor layers 101b, 102b and 202b containing the added element at the low concentration or not containing the added element are provided at the interface between the adjacent conductor film 101a and the main conductor film 14, the interface between the adjacent conductor film 102a and the main conductor film 15, and the interface between the adjacent conductor film 202a and the main conductor film 18, the generation of the precipitate in the vicinity of the interface can be suppressed, which avoids a precipitate in the vicinity of the interface that is not etched and remains in the patterning of the wiring line by etching, and thus prevents a short circuit being caused even in the case where the wiring line intervals D1, D2, D3 and D4 are 0.4 µm or less.

Next, as a second embodiment, in an aluminum wiring line containing copper, in order to explain a precipitation preventing effect of lowering the copper content in the vicinity of an interface to an adjacent conductor layer, an analyzing example by a molecular dynamics simulation will be described. As described in, for example, Journal of Applied Physics, Vol. 54 (1983), pp. 4864 to 4878, the molecular dynamics simulation is a method in which a force acting on each atom through an interatomic potential is calculated, and Newton's equation of motion is solved on the basis of the force, so that a position of each atom at each time is calculated.

Incidentally, in this embodiment, the following relation could be obtained by calculating an interaction between different kinds of elements by incorporating an electric charge movement into the molecular dynamics method.

Figure 3:
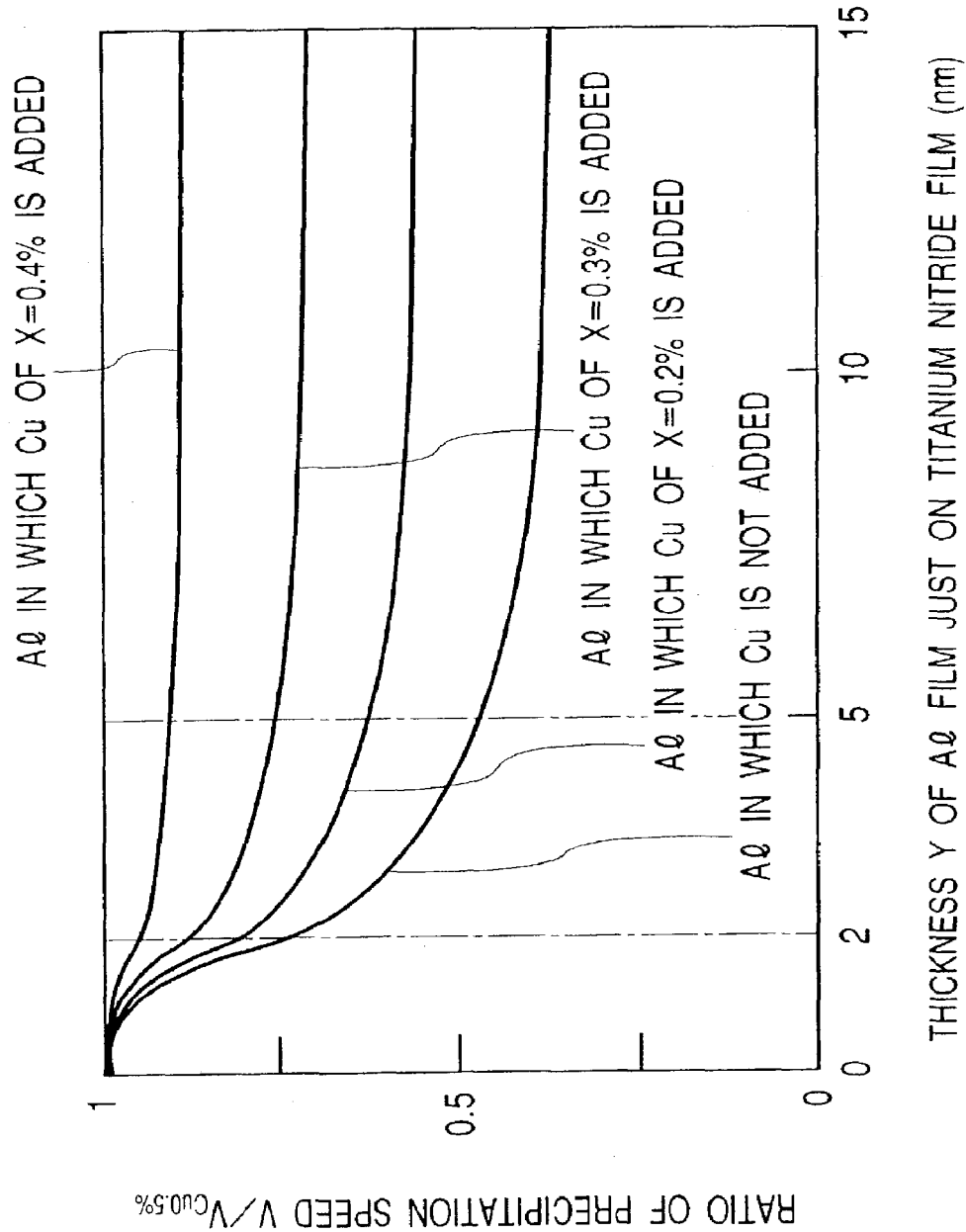
FIG. 3 is a view showing a relation between a precipitation speed of copper in an aluminum wiring line and a copper concentration according to a second embodiment of the present invention.

With respect to a laminate film in which an aluminum alloy layer containing copper of X % by weight and having a thickness of Y nm is deposited on a titanium nitride film, and an aluminum layer containing copper of 0.5% by weight is deposited thereon, a temperature is set to 500° K and a simulation of copper precipitation is carried out, and the dependency of a precipitation speed V upon a copper concentration X and a thickness Y is analyzed. The result is shown in FIG. 3. In FIG. 3, the precipitation speed in the case where copper of X=0.5% by weight is added is made $V_{Cu0.5\%}$, and the result is shown. The precipitation speed in the simulation means a speed at which copper atoms are further collected in a portion where copper atoms have been collected in aluminum crystal, and is defined as the number of copper atoms collected in a unit time. As is understood from FIG. 3, when the concentration X of copper is made low, the ratio $V/V_{Cu0.5\%}$ of the precipitation speed is decreased. Besides, as the thickness of a film containing copper at a low concentration becomes large, the ratio $V/V_{Cu0.5\%}$ of the precipitation speed is decreased, and the effect of preventing the precipitation of copper becomes remarkable, and the effect is almost saturated, in a thickness of 5 nm or more. By this, it is understood that the precipitation of copper can be suppressed by lowering the concentration of copper around the interface between the aluminum wiring line and the adjacent conductor layer. Besides, it is understood that the precipitation of copper can be remarkably suppressed when a film containing copper at a content X of from 0% to 0.2% by weight and having a thickness of 5 nm or more exists around the interface between the aluminum wiring line and the adjacent conductor layer.

Figure 4:
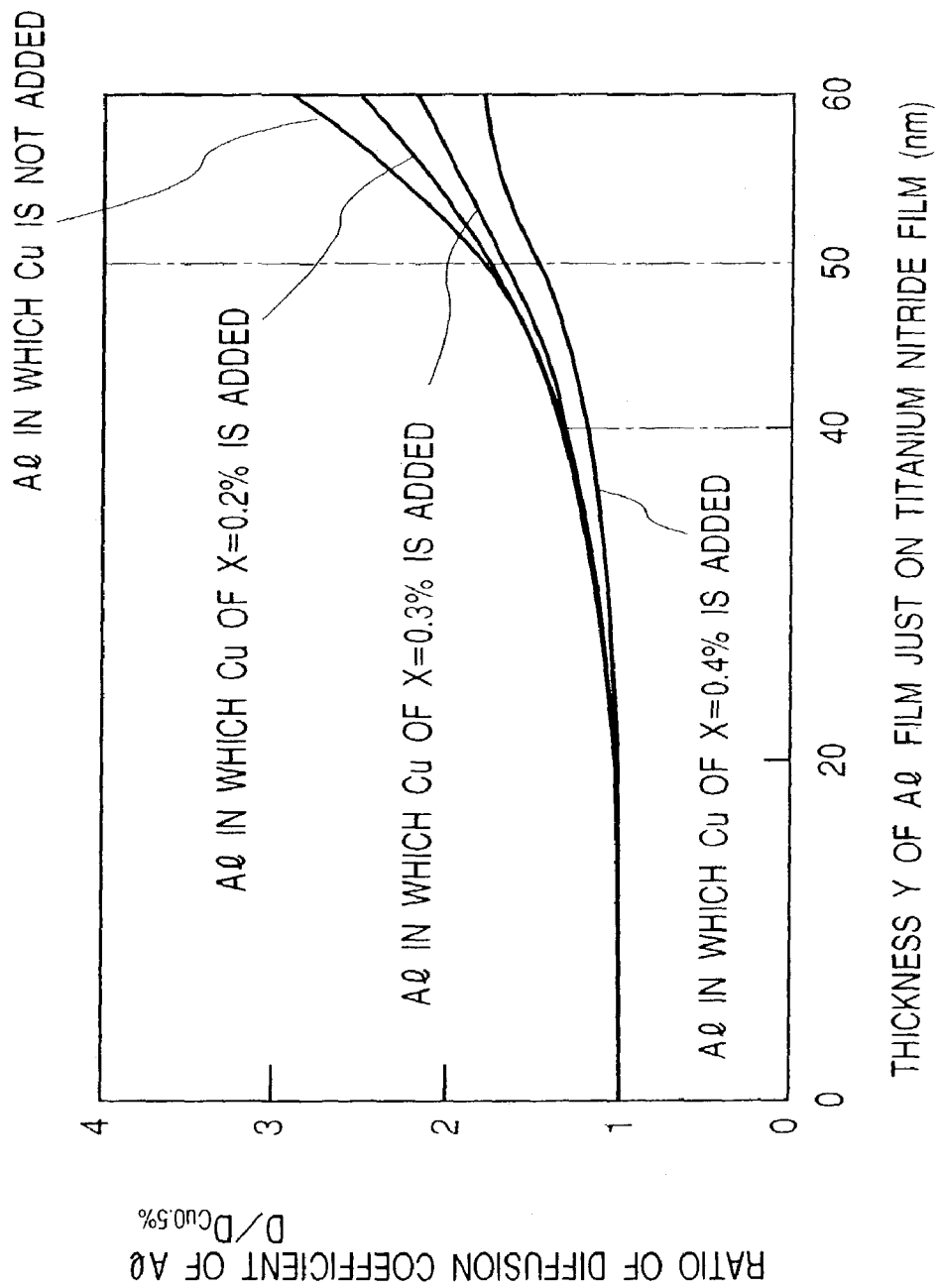
FIG. 4 is a view showing a relation between a diffusion coefficient of aluminum in an aluminum wiring line and a copper concentration according to the second embodiment of the present invention.

However, it is conceivable that migration resistance becomes low when the concentration of copper, which is added to raise the migration resistance of an aluminum wiring line, is made low and the thickness of the film containing copper at a low concentration is made large. Then, the dependency of a diffusion coefficient D of aluminum upon the copper concentration X and the thickness Y is analyzed. The result is shown in FIG. 4. In FIG. 4, the diffusion coefficient of aluminum in the case where copper is X=0.5% by weight is added is made $D_{Cu0.5\%}$, and the result is shown. As is understood from the drawing, as the concentration X of copper becomes low and the thickness Y of the wiring line becomes large, the diffusion coefficient of aluminum becomes large, and the migration resistance becomes low. However, it is understood that if the thickness Y is 40 nm or less, the diffusion coefficient of aluminum can be almost suppressed even if the concentration of copper is low.

From the above, it is understood that if the film containing copper at a content of from 0% to 0.2% by weight and having a thickness of from 5 nm to 40 nm exists between the titanium nitride film and the aluminum wiring line containing copper of 0.5% by weight, the migration of aluminum can be prevented and the precipitation of copper can be suppressed.

The above effect can also be shown in the case other than 500° K in the same way. When the temperature becomes 350° K or lower, precipitation of copper becomes low so that it can not be confirmed by this simulation. Besides, when the temperature becomes as high as 550° K or higher, the copper becomes apt to be dissolved, and the precipitation becomes hard to produce. From the above, the temperature between 350° K and 550° K is a temperature at which the precipitation is easiest to produce. Accordingly, in order to prevent the precipitation, it is more desirable to combine a method of providing a region where a copper content is low and a method of lowering a temperature to 350° K or less by rapid cooling after a film is formed at a temperature of 550° K or higher. Here, to cool something rapidly as compared with a case where it is left naturally is called rapid cooling, and, for example, can be at least 100° C./min. For the rapid cooling, for example, a cooling gas or fluid is used. Besides, in order to realize a sufficiently dissolved state before the rapid cooling, it is preferable to rapidly cool after atomic precipitation is ended and a high temperature state is kept for, for example, 5 seconds or more. In the case where a heat treatment is carried out before a wiring pattern is formed by etching or the like after the rapid cooling, it is preferable to carry out the heat treatment at a high temperature of 550° K or higher in order to prevent the precipitation of copper, and when cooling is made, rapid cooling is preferable.

Figure 5:
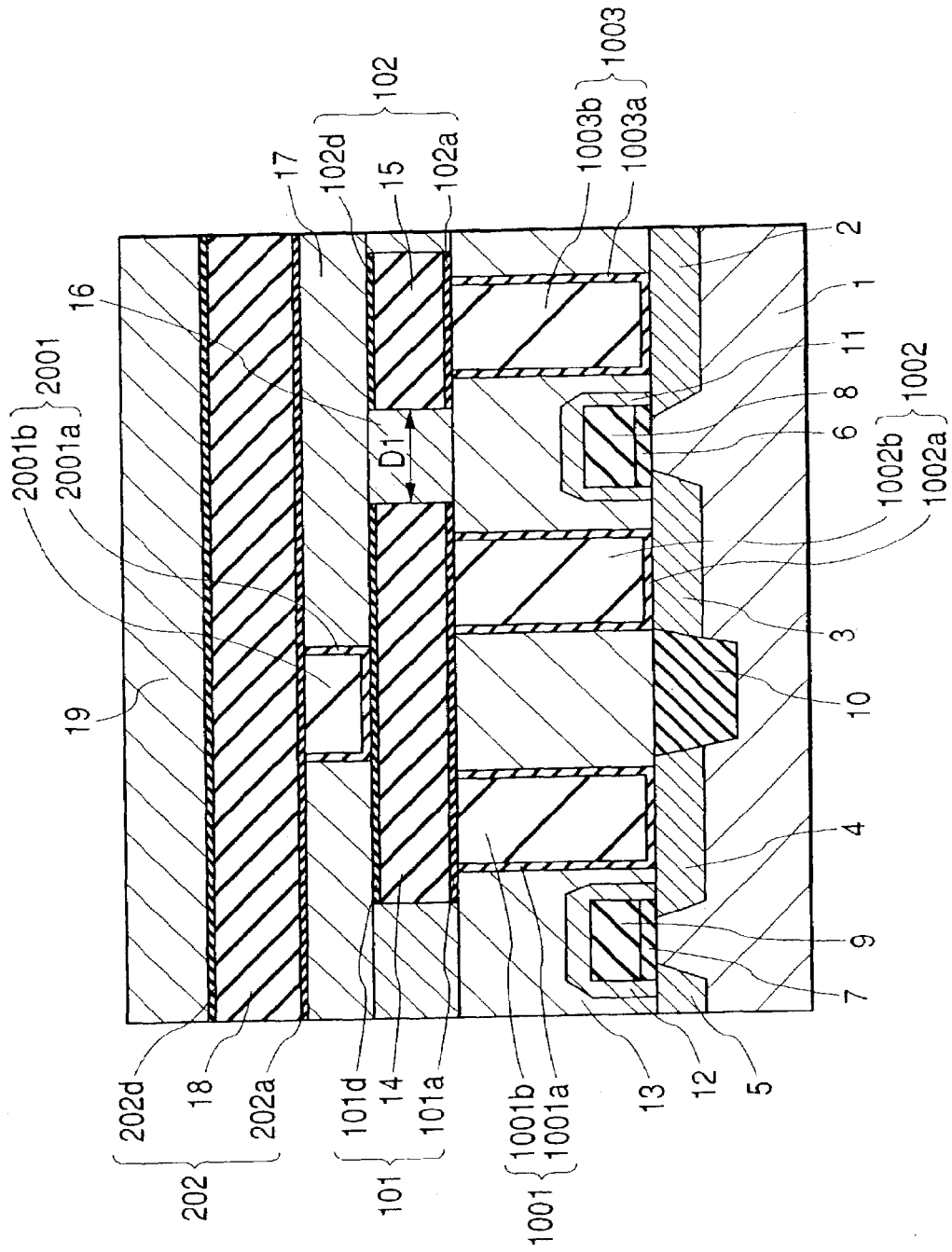
FIG. 5 is a sectional view of a main portion of a semiconductor device according to a third embodiment of the present invention.

Next, FIG. 5 shows a sectional structure of a main portion of a semiconductor device according to a third embodiment of the present invention. The third embodiment is different from the first embodiment in that in a first laminate wiring line and a second laminate wiring line, the structure of main conductor films 14, 15 and 18 are such that an added element to prevent migration is contained at a high concentration in the inside of each of the films, and the concentration of the added element becomes low in the vicinity of an interface to adjacent conductor films 101a, 102a, and 202a. The other constitutions are the same. By this, the same effect as the semiconductor device of the first embodiment shown in FIG. 1 can be obtained, the generation of a precipitate in the vicinity of the interface can be suppressed, which avoids the precipitate not being etched and remaining at the patterning of the wiring line by etching, and accordingly prevents a short circuit even in the case where a wiring line interval D1 is 0.4 μm or less.

Figure 6:
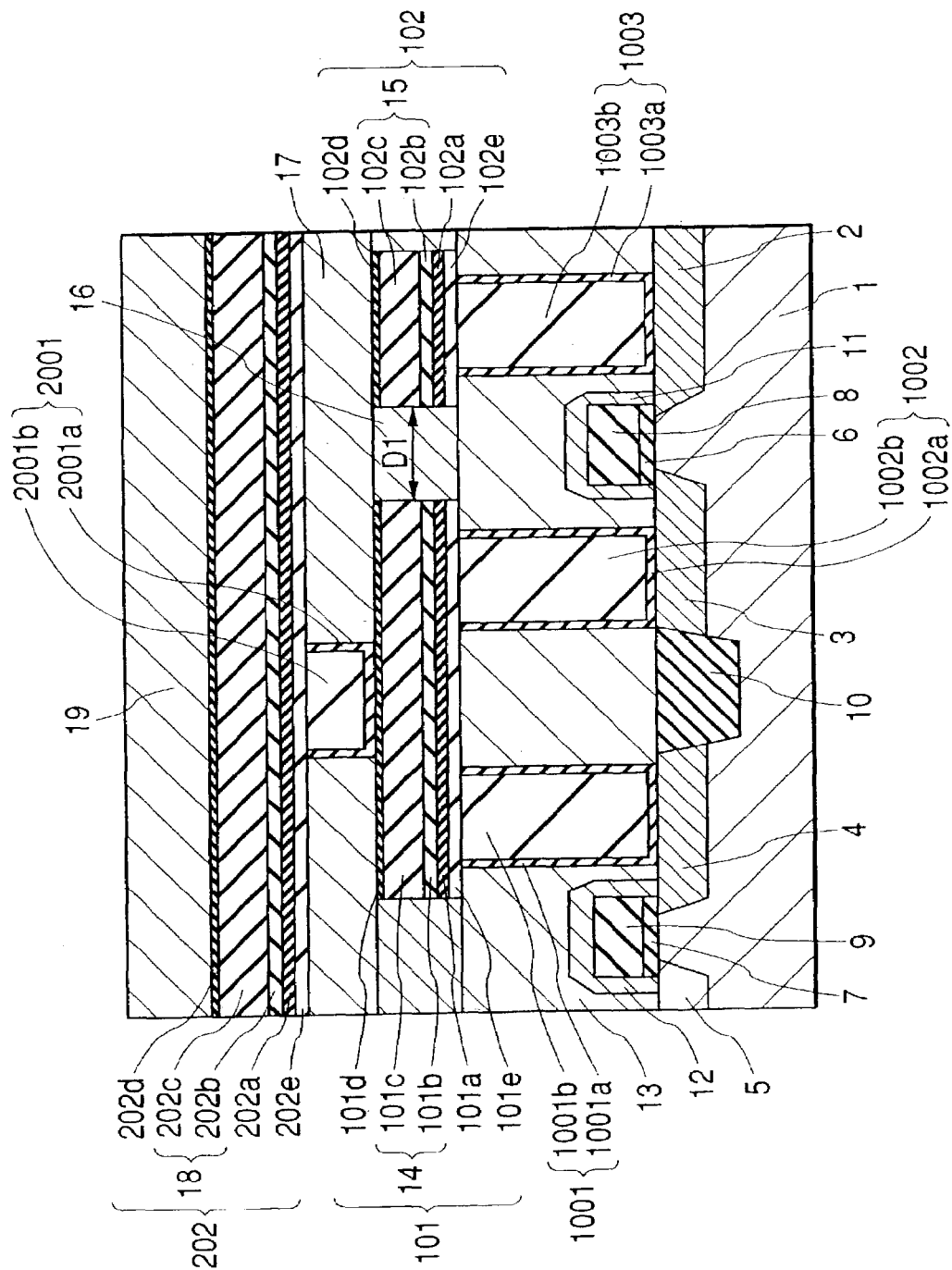
FIG. 6 is sectional view of a main portion of a semiconductor device according to a fourth embodiment of the present invention.

Next, FIG. 6 shows a sectional structure of a main portion of a semiconductor device according to a fourth embodiment of the present invention. The fourth embodiment is different from the first embodiment in that in a first laminate wiring line and a second laminate wiring line, adjacent conductor films 101e, 102e, and 202e which become other barrier films, are formed at the outside of adjacent conductor films 101a, 102a, and 202a which become barrier films of main conductor films 14, 15 and 18. Although not shown, another barrier film of one or more layers may be formed further at the outside. Besides, the number of layers of the barrier films of each of the main conductor films 14, 15 and 18 may not be the same. The main conductor films 14, 15 and 18 are respectively formed of main conductor layers 101c, 102c, and 202c containing an added element, to prevent migration, at a high concentration, and main conductor layers 101b, 102b and 202b containing no added element or containing an added element at a low concentration, and by this, the same effect as the semiconductor device of the first embodiment shown in FIG. 1 can be obtained. That is, the generation of a precipitate in the vicinity of the interface between, e.g., main conductor films 14, 15 and 18, on the one hand, and adjacent conductor films 101a, 102a and 202a, on the other, can be suppressed, which avoids a precipitate that is not etched and remains at the patterning of the wiring line by etching, and prevents this cause of a short circuit even in the case where a wiring line interval D1 is 0.4 μm or less.

Figure 7:
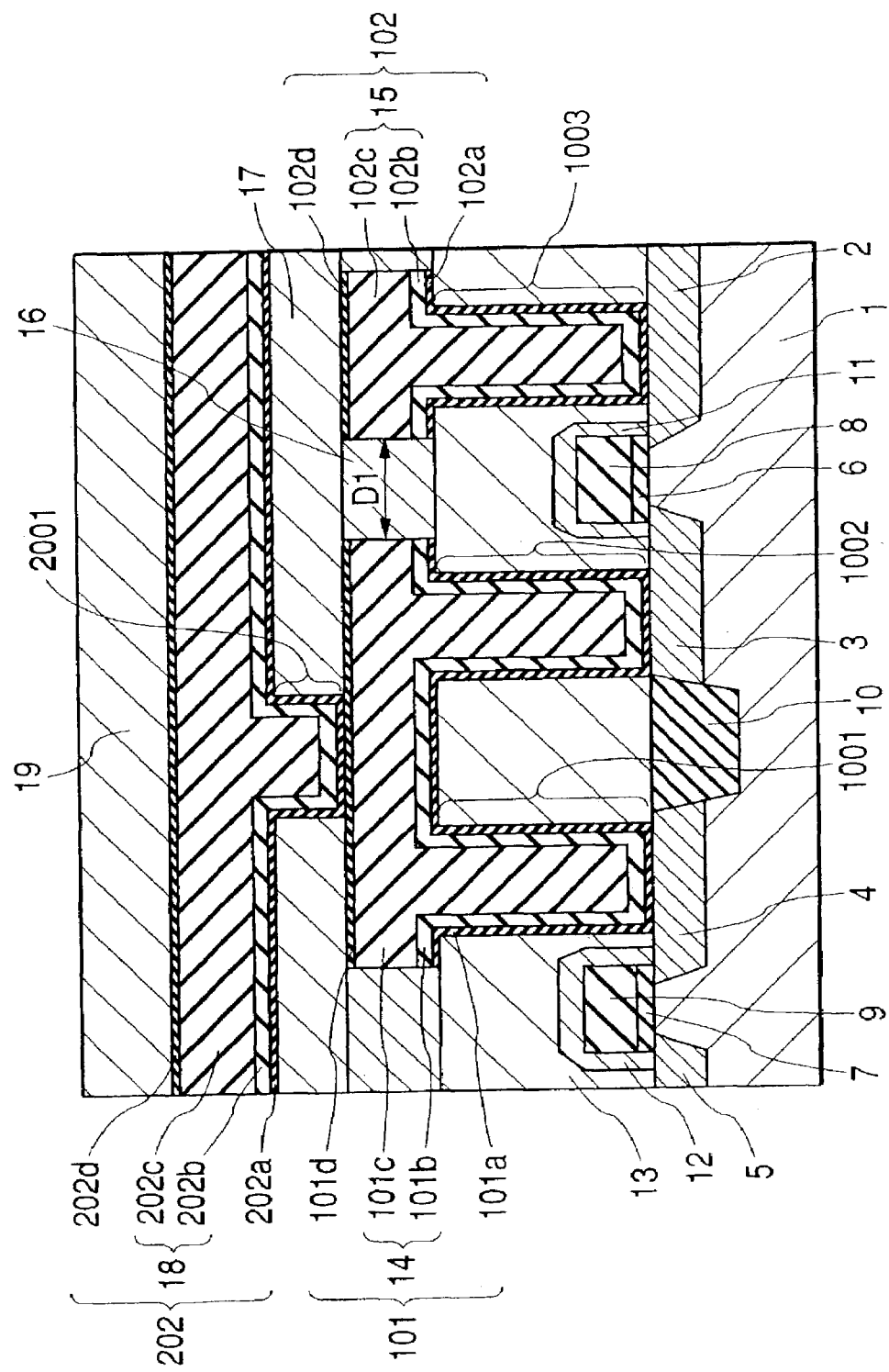
FIG. 7 is a sectional view of a main portion of a semiconductor device according to a fifth embodiment of the present invention.

Next, FIG. 7 shows a sectional structure of a main portion of a semiconductor device according to a fifth embodiment of the present invention. The fifth embodiment is different from the first embodiment in that first laminate wiring lines 101 and 102 and plugs 1001, 1002, and 1003 are formed by the same step, for example, a physical growth method such as a sputtering method, and a second laminate wiring line 202 and a plug 2001 are formed by the same step, for example, a physical growth method such as a sputtering method.

Here, the plugs 1001, 1002 and the first laminate wiring line 101, and the plug 1003 and the first laminate wiring line 102, are respectively made of adjacent conductor films 101a, 101d and 102a, 102d for preventing diffusion, and main conductor films 14, 15. Further, the main conductor film 14 is formed of a main conductor layer 101c containing an added element, to prevent migration, at a high concentration, and a main conductor layer 101b containing an added element at a concentration lower than the concentration in the main conductor layer 101c or not containing the added element, and the main conductor layer 101b is in contact with the adjacent conductor film 101a. Besides, the main conductor film 15 is also formed of a main conductor layer 102c containing an added element to prevent migration at a high concentration, and a main conductor layer 102b containing an added element at a concentration lower than the concentration in the main conductor layer 102c or not containing the added element, and the main conductor layer 102b can be in contact with the adjacent conductor film 102a.

A plug 2001 and a second laminate wiring line 202 are formed of adjacent conductor films 202a and 202d for preventing diffusion and a main conductor film 18 coated. Further, the main conductor film 18 is formed of a main conductor layer 202c containing an added element, to prevent migration, at a high concentration, and a main conductor layer 202b containing the added element at a concentration lower than the concentration in the main conductor layer 202c or not containing the added element, and the main conductor layer 202b can be in contact with the adjacent conductor film 202a.

The main conductor films 14, 15 and 18 are formed of main conductor layers 101c, 102c, and 202c containing an added element, to prevent migration, at a high concentration, and main conductor layers 101b, 102b and 202b containing an added element at a low concentration or not containing the added element. The same effect as the semiconductor device of the first embodiment shown in FIG. 1 can be obtained in this fifth embodiment; that is, the generation of a precipitate at the vicinity of the interface between the main conductor films and adjacent conductive films can be suppressed, which avoids the precipitate which is not etched and remains at the patterning of the wiring line by etching, and prevents a short circuit due to a remaining precipitate even in the case where a wiring line interval D1 is 0.4 μm or less.

Besides, the adjacent conductor film of FIG. 5 shown in the third embodiment and the adjacent conductor film of FIG. 7 shown in the fifth embodiment may be formed of two or more layers as in the adjacent conductor film of FIG. 6 shown in the fourth embodiment. Besides, the main conductor film constituting the wiring line of FIG. 7 shown in the fifth embodiment may be formed of one layer as in the main conductor film constituting the wiring line of FIG. 5 shown in the third embodiment, and the concentration of the added element may be made lower at a portion in the vicinity of the interface between the main conductor film and the adjacent conductor film than the concentration of the added element at another portion spaced from the interface.

Besides, the first wiring line and the second wiring line may be constructed by a wiring line structure of a combination of the structures of the first wiring line and the second wiring line shown in the respective embodiments, and a third wiring line or the like may further be formed on an upper portion of the second wiring line in the structure of the wiring line shown in the respective embodiments.

What is claimed is:

1. A method of making a semiconductor device, comprising:
    forming a first insulating layer on a semiconductor substrate;
    forming an adjacent conductor film overlying said first insulating layer;
    forming a laminate wiring line overlying said adjacent conductor film,
    wherein said forming said laminate wiring line includes:
    forming a first main wiring layer, of the laminate wiring line, overlying said adjacent conductor film, whereby said adjacent conductor film is between said first insulating layer and said first main wiring layer, and
    forming a second main wiring layer, of the laminate wiring line, laminated on said first main wiring layer, each of the first and second main wiring layers including a main constituent material and at least said second main wiring layer including an added material, said main constituent material of each of said first main wiring layer and said second main wiring layer being the same material, wherein each of the first and second main wiring layers includes aluminum as the main constituent material and at least said second main wiring layer including copper as the added material,
    wherein said adjacent conductor film is for preventing diffusion of the main constituent material, and
    wherein a concentration of the added material in said first main wiring layer is less than that in said second main wiring layer;
    forming a second adjacent conductor film overlying the second main wiring layer for preventing diffusion of the main constituent material;
    after forming the second adjacent conductor film, forming a second insulating film on the second adjacent conductor film; and
    forming an electrically conductive plug through the second insulating film and electrically connected to said laminate wiring line.

2. The method of making a semiconductor device according to claim 1, wherein the concentration of copper in the second main wiring layer is at least 0.4% by weight and the concentration of copper in the first main wiring layer is from 0% to 0.2% by weight.

3. The method of making a semiconductor device according to claim 1, wherein said second main wiring layer is formed at a temperature of at least 550° K, and thereafter the second main wiring layer is cooled rapidly.

4. The method of making a semiconductor device according to claim 3, wherein said second main wiring layer is cooled rapidly by providing a fluid to cool the second main wiring layer.

5. The method of making a semiconductor device according to claim 1, wherein:
    said adjacent conductor film includes titanium or titanium nitride as the main constituent material.

6. The method of making a semiconductor device according to claim 1, wherein said first main wiring layer is located nearer to said first insulating layer than said second main wiring layer is to said first insulating layer.

7. The method of making a semiconductor device according to claim 1, further comprising forming another laminate wiring line overlying said first insulating layer, formed of said first main wiring layer and said overlying said first insulating layer, formed of said first main wiring layer and said second main wiring layer, and wherein said laminate wiring line and said another laminate wiring line are spaced at most 0.4 µm from each other.

8. The method of making a semiconductor device according to claim 7, wherein the method further includes forming another adjacent conductor layer for the another laminate wiring line, with the first main wiring layer of the another laminate wiring line being formed on the another adjacent conductor layer for the another laminate wiring line.

9. The method of making a semiconductor device according to claim 1, wherein the first main wiring layer is formed to have a thickness of 5 nm to 40 nm.

10. The method of making a semiconductor device according to claim 1, further comprising forming another electrically conductive plug, through the first insulating layer, the laminate wiring line being formed after forming said another electrically conductive plug and being electrically connected thereto.

11. The method of making a semiconductor device according to claim 10, wherein said laminate wiring layer is formed so as to be electrically connected to a semiconductor element of said semiconductor device, via said another electrically conductive plug through said first insulating layer.

12. The method of making a semiconductor device according to claim 1, comprising the further step of forming another adjacent conductor film, for preventing diffusion of the main constituent material, the another adjacent conductor film being positioned between the second insulating layer and the second main wiring layer.

13. The method of making a semiconductor device according to claim 1, wherein said adjacent conductor film is adjacent said first insulating layer and adjacent said first main wiring layer.

14. The method of making a semiconductor device according to claim 1, wherein said adjacent conductor film is adjacent said first main wiring layer.

15. The method of making a semiconductor device according to claim 1, wherein the first and second main wiring layers are in contact with each other.

16. The method of making a semiconductor device according to claim 15, wherein the first main wiring layer is in contact with said adjacent conductor film.

17. The method of making a semiconductor device according to claim 16, wherein said adjacent conductor film is in contact with said first insulating layer.

18. The method of making a semiconductor device according to claim 1, wherein the first main wiring layer is in contact with said adjacent conductor film.

19. The method of making a semiconductor device according to claim 1, wherein the main constituent material of said first main wiring layer and that of the adjacent conductor film are different materials.

20. The method of making a semiconductor device according to claim 1, wherein a thickness of said second main wiring layer is greater than that of said adjacent conductor film and said second adjacent conductor film.

21. A method of making a semiconductor device, comprising:
   forming a first insulating layer on a semiconductor substrate;
   forming an adjacent conductor film overlying said first insulating layer;
   forming a wiring line overlying said adjacent conductor film,
   wherein said forming said wiring line includes:
   depositing material of the wiring line overlying the adjacent conductor film, the material deposited being a single layer and having a first portion closest to the adjacent conductor film and a second portion further from the adjacent conductor film than the first portion, the second portion having a higher concentration of an added element than the concentration of the added element in the first portion, the adjacent conductor film being between said first insulating layer and said first portion,
   wherein said adjacent conductor film is for preventing diffusion of a main constituent material of said material of the wiring line,
   wherein said main constituent material of said first portion is the same material as the main constituent material of said second portion, and
   wherein said main constituent material is aluminum, and said added element is copper;
   forming a second adjacent conductor film overlying the second main wiring portion for preventing diffusion of the main constituent material;
   after forming the second adjacent conductor film, forming a second insulating film on the second adjacent conductor film; and
   forming an electrically conductive plug through the second insulating film and electrically connected to said wiring line.

22. The method of making a semiconductor device according to claim 21, further comprising forming another electrically conductive plug, through the first insulating layer, the wiring line being formed after forming said another electrically conductive plug and being electrically connected thereto.

23. The method of making a semiconductor device according to claim 21, wherein the main constituent material of said first portion of material of the wiring line and that of the adjacent conductor film are different materials.

24. A semiconductor device according to claim 21, wherein a thickness of said second portion of material of the wiring line is greater than that of said adjacent conductor film and said second adjacent conductor film.

* * * * *